US009281285B1

(12) United States Patent
Atesal et al.

(10) Patent No.: US 9,281,285 B1
(45) Date of Patent: Mar. 8, 2016

(54) INPUT/OUTPUT TERMINATION FOR RIPPLE PREVENTION

(71) Applicant: Analog Devices Global, Hamilton (BM)

(72) Inventors: Yusuf Alperen Atesal, Istanbul (TR); Turusan Kolcuoglu, Istanbul (TR)

(73) Assignee: Analog Devices Global, Hamilton (BM)

(*) Notice: Subject to any disclaimer, the term of this patent is extended or adjusted under 35 U.S.C. 154(b) by 0 days.

(21) Appl. No.: 14/502,363

(22) Filed: Sep. 30, 2014

(51) Int. Cl.
| | |
|---|---|
| *H01L 23/60* | (2006.01) |
| *H01L 23/66* | (2006.01) |
| *H01L 23/00* | (2006.01) |
| *H01L 27/02* | (2006.01) |
| *H01L 23/50* | (2006.01) |
| *H01L 23/64* | (2006.01) |
| *H04B 3/32* | (2006.01) |

(52) U.S. Cl.
CPC ............ *H01L 23/66* (2013.01); *H01L 23/50* (2013.01); *H01L 23/60* (2013.01); *H01L 23/642* (2013.01); *H01L 23/647* (2013.01); *H01L 24/49* (2013.01); *H01L 27/0248* (2013.01); *H04B 3/32* (2013.01); *H01L 2924/1205* (2013.01); *H01L 2924/1207* (2013.01); *H01L 2924/1421* (2013.01)

(58) Field of Classification Search
CPC ............................. H01L 23/60; H01L 23/66
See application file for complete search history.

(56) References Cited

U.S. PATENT DOCUMENTS

| | | | | |
|---|---|---|---|---|
| 5,165,055 | A * | 11/1992 | Metsler | G06F 1/182 333/12 |
| 6,608,390 | B2 * | 8/2003 | Beatson | H01L 23/13 257/784 |
| 7,765,376 | B2 | 7/2010 | Gillingham et al. | |
| 8,558,398 | B1 | 10/2013 | Seetharam | |
| 8,570,701 | B2 * | 10/2013 | Adomaitis | H05K 9/0067 361/119 |

* cited by examiner

*Primary Examiner* — Evan Pert
(74) *Attorney, Agent, or Firm* — Knobbe, Martens, Olson & Bear, LLP

(57) ABSTRACT

Aspects of this disclosure relate to a termination circuit configured to mitigate crosstalk from a radio frequency (RF) input/output (I/O) path to a second I/O path, such as a digital I/O path. Such crosstalk can be due to coupling between adjacent bond wires, for example. The termination circuit can include a low impedance loss path, such as a series RC shunt circuit. According to certain embodiments, an electrostatic discharge (ESD) protection circuit can be in parallel with the termination circuit.

20 Claims, 5 Drawing Sheets

INPUT/OUTPUT TERMINATION FOR RIPPLE PREVENTION

TECHNICAL FIELD

The disclosed technology relates to electronics, and, more particularly, to a termination circuit electrically connected to an input/output.

DESCRIPTION OF THE RELATED TECHNOLOGY

Electronic devices are being manufactured with increasingly smaller sizes. For instance, wideband control products, such as switches and attenuators, are being widely used in various applications, such as transceivers, sources, analyzers, etc. In these applications, minimizing die and package size while minimizing performance changes over bandwidth, such as changes in gain and/or loss over bandwidth, can be desirable. At the same time, it can be desirable to have a relatively high electrostatic discharge (ESD) protection level.

Such control products can include multiple digital input/output (I/O) pins and multiple radio frequency (RF) I/O pins in a relatively small area. As one example, a serial peripheral interface (SPI) controlled digital attenuator can be implemented in a 4 mm×4 mm quad flat no-leads (QFN) package. Crosstalk inside the package from an RF input (and/or an RF output) can result in undesired effects that can cause changes in performance over bandwidth. This can limit operational bandwidth of a product and/or deteriorate circuit performance, such as attenuation accuracy of an attenuator.

SUMMARY OF CERTAIN INVENTIVE ASPECTS

One aspect of this disclosure is an electronic device that includes a die, a first bond wire, a second bond wire, and a termination circuit. The die includes a radio frequency (RF) input/output path electrically connected to a first bond pad of the die and a second input/output path electrically connected to a second bond pad of the die. The RF input/output path is configured to process an RF signal. The second I/O path is configured to process a non-RF signal (a signal that is not an RF signal). The first bond wire is electrically connected to the first bond pad of the die. The second bond wire is electrically connected to the second bond pad of the die. The termination circuit is electrically connected to the second bond pad of the die. The termination circuit is configured to mitigate effects of crosstalk due to coupling between the first bond wire and the second bond wire by providing a load for the second I/O path such that the second I/O path is dampened.

The die can include an electrostatic device protection circuit in parallel with the termination circuit. The die can also include at least one of an attenuator, a switch, or a phase shifter. The electronic device can include a package encapsulating the die, the first bond wire, and the second bond wire, in which the package includes a first pin and the first bond wire is electrically connected to the first pin.

The termination circuit can be embodied on the die. The termination circuit can include a series RC circuit. The termination circuit can be configured to prevent a load on the die that is electrically connected to the second bond pad from resonating due to the crosstalk.

The second input/output path can be a digital input/output path and the second signal can be a digital signal.

Another aspect of this disclosure is an apparatus that includes a first input/output, a second input/output path, and an RC circuit. The first input/output path is electrically connected to a first contact of a die. The first input/output path is configured to carry a radio frequency signal. The second input/output path is electrically connected to a second contact of the die. The second input/output path is configured to carry a non-RF signal. In the apparatus, there is crosstalk between the first input/output path and the second input/output path. The RC circuit electrically is connected between the second contact of the die and a reference potential.

The apparatus can include an electrostatic discharge protection circuit in the die, in which the RC circuit is in parallel with the electrostatic discharge protection circuit. The second signal can be a digital signal. The reference potential can be ground.

The apparatus can include a first bond wire electrically connected to the first contact of the die and a second bond wire electrically connected to the second contact of the die, in which the first input/output path is configured to couple with the second input/output path by way of coupling between the first bond wire and the second bond wire.

The RC circuit can be a series RC circuit. The RC circuit can be configured to prevent an effective capacitance of a load of the die electrically connected to the second input/output path from resonating due to crosstalk between the first input/output path and the second input/output path. The load can include an electrostatic discharge protection circuit and an input/output buffer. The crosstalk can be due to coupling external to the die.

Another aspect of this disclosure is a die that includes a first input/output path, a second input/output path, an electrostatic discharge protection circuit, and a low impedance loss path. The first input/output path is configured to carry a radio frequency signal. The second input/output path is configured to carry a non-RF signal. The electrostatic discharge protection circuit is configured to provide electrostatic discharge protection on the second input/output path. The low impedance loss path is configured to present an impedance at a frequency of the radio frequency signal to prevent a resonance on the second input/output path due to crosstalk between the first input/output line and the second input/output line.

The low impedance loss path can include a series RC circuit. The crosstalk can be due to coupling on the die.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments and are not intended to be limiting.

FIGS. 2A, 2B, and 2C each illustrate a different termination circuit.

DETAILED DESCRIPTION OF CERTAIN EMBODIMENTS

Figure 1:
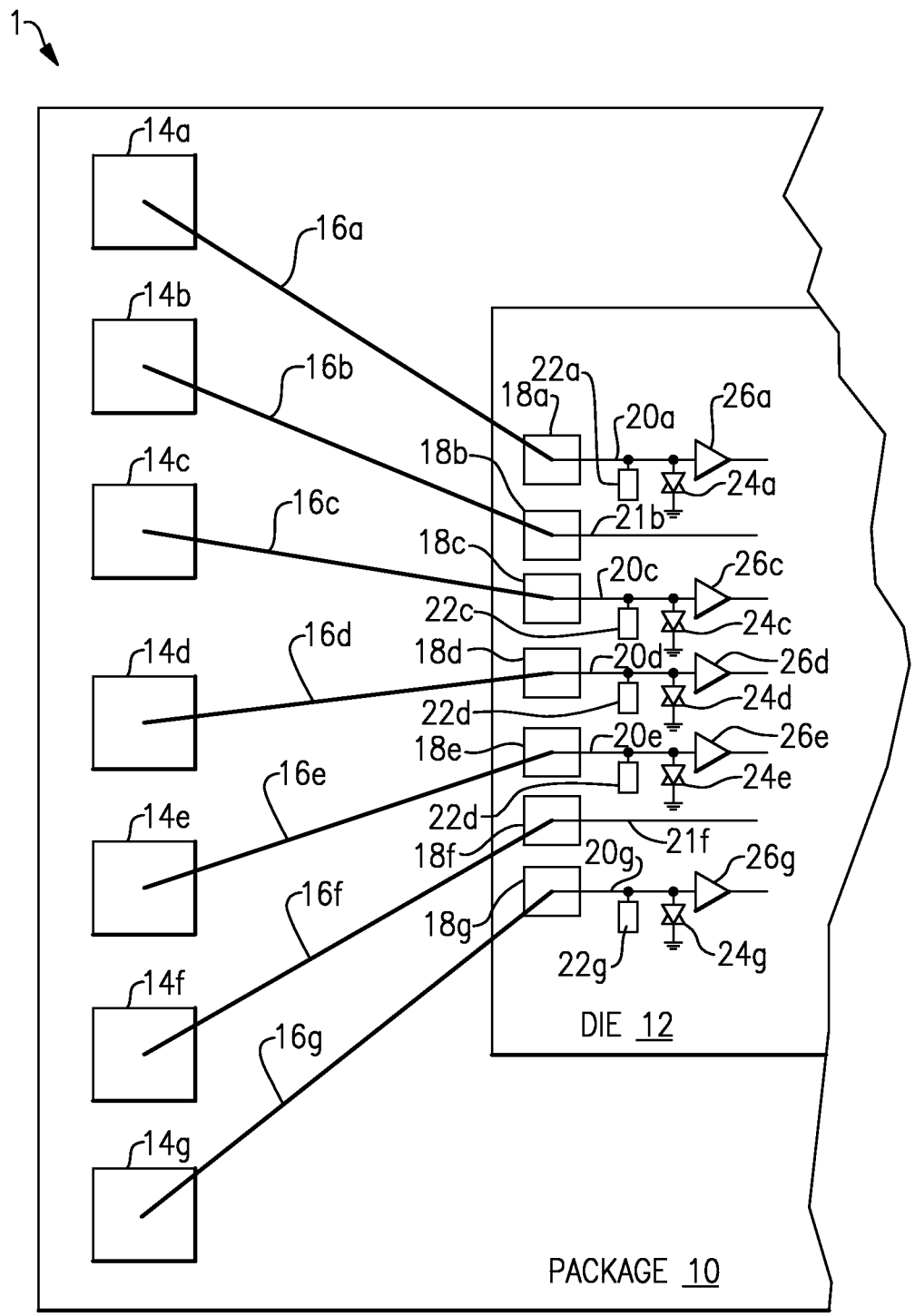
FIG. 1 is a plan view schematic diagram of a portion of a packaged device, according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale.

As discussed above, an RF input/output can cause crosstalk on an another input/output within a package. As used herein, "input/output" encompasses an input, an output, or a combined input and output. Accordingly, any features discuss herein related to an "input/output" can be applied to an input, to an output, or to a combined input and output. An "input/output" is equivalently referred to as an "I/O" herein. Crosstalk from the RF input/output can result in an undesired effect that can cause a change in performance over bandwidth. For instance, the crosstalk inside the package from an RF input/output to a digital input/output can resonate with a load electrically connected to the digital input/output on a die, such as a semiconductor die. This can result in an unwanted and/or unexpected resonance, which can create a low or high impedance RF path at and/or near resonance, and hence can in turn cause fluctuations (e.g., ripples) in the gain and/or loss frequency response of a device that includes the die. Such fluctuations can reduce the operation bandwidth of the device and/or deteriorate device performance, such as attenuation accuracy of an attenuator.

Introducing a ground shield (e.g., a ground pin on a package of the device, a ground pad on the die, and a ground bond wire) between a digital input/output and an RF input/output can reduce crosstalk between the digital input/output and the RF input/output. Alternatively or additionally, having perpendicular bond wire placements can reduce crosstalk. However, these ways of reducing crosstalk can increase package and/or die size significantly. Accordingly, they may not be practical for relatively small sized, multi-pin devices. A termination method that can prevent resonances due to crosstalk between an RF input/output and another non-RF input/output while maintaining circuit performance and/or ESD protection levels can be desirable, particularly if such a method were implemented with no more than a relatively small impact on area of the die and the package.

Fluctuations in a frequency response of a circuit can be due to a resonance of the capacitive loading of a digital I/O pad of an integrated circuit die and the crosstalk between an RF I/O bond wire and a digital I/O bond wire. In certain applications, the capacitive load on an integrated circuit die pad can be dominated by the capacitance of an ESD protection circuit and an input/output buffer, especially for applications that desire greater than about 1000 kV of ESD protection. RF current coupled from RF bond wires to digital I/O bond pads can create high Q RF resonances. A high Q RF resonance can refer to an RF resonance with Q being at least 50, for example.

Electrically connecting a loss component, such as a resistor, in series between a digital I/O pad and an ESD protection circuit on die can reduce the resonances that result from crosstalk with an RF input/output. However, such a loss component can significantly reduce the ESD rating and/or have a relatively large size.

Aspects of this disclosure relate to a loss path in parallel with an ESD protection circuit and/or input/output buffers. The loss path can present a lower impedance than the load at the operating frequency range of the load. Accordingly, in certain applications, the loss path can reduce or eliminate the resonances and also preserve substantially the same ESD rating. The loss path can be, for example, a series RC shunt circuit electrically connected to an I/O on a die.

Referring to FIG. 1, a portion of an electronic device 1 will be described. The electronic device 1 is a packaged device. The electronic device includes a package 10 and a die 12 that is encapsulated by the package 10. It will be understood that the electronic device 1 can include more elements than illustrated and/or that some embodiments include a subset of the illustrated elements. For instance, only a portion of the die 12 is illustrated. Other portions of the die (not illustrated) can include a variety of other circuits, such as an attenuator, an amplifier, a mixer, a switching component such as a multi-throw switch, a phase shifter, or any other suitable circuits configured to process RF and/or digital signals. The other circuits can be control circuits. In some instances, one or more digital signals can be used as control signals for a circuit that processes an RF signal. Moreover, while the digital I/O lines are illustrated as being digital inputs in FIG. 1, it will be understood that the principles and advantages discussed with reference to FIG. 1 can be applied to digital outputs or combined digital inputs and outputs. In some other embodiments, the principles and advantages discussed with reference to FIG. 1 can be applied to non-RF analog inputs and/or outputs or combined digital and/or analog inputs and/or outputs.

The illustrated package 10 includes pins 14a to 14g. As illustrated, the package 10 is a quad-flat no-lead (QFN) package. It will be understood that the principles and advantages discussed herein can be applied to any other suitable type of package and contact. For example, other types of contacts can include, but are not limited to, sockets, balls, and lands. The package 10 can include a carrier substrate on which the die 12 is mounted. Each of the pins 14a to 14g of the package 10 is electrically connected to the die 12 by way of a respective bond wire 16a to 16g in FIG. 1.

The die 12 can be a silicon die as illustrated. In certain embodiments, the die 12 is a silicon-on-insulator die or other semiconductor die. The die 12 can alternatively be any other suitable type of die that can benefit from ripple prevention on an I/O. The illustrated die 12 includes die pads 18a to 18g that are electrically connected to respective pins 14a to 14g by way of respective bond wires 16a to 16g. Any suitable number of pins, bond wires, and die pads can be implemented in the electronic device 1. A bond wire can also be referred to as a wirebond or a ribbon-bond. In the embodiment of FIG. 1, the die 12 includes RF I/Os and digital I/Os. Die pads 18a, 18c, 18d, 18e, and 18g are configured to receive digital signals and die pads 18b and 18f are configured to receive RF signals.

Digital I/O lines 20a, 20c, 20d, 20e, and 20g are configured to carry digital signals. These digital I/O lines can provide digital signals to digital circuits for further processing. The digital I/O line 20a electrically connects the die pad 18a to a termination circuit 22a and a load that includes ESD protection circuit 24a and buffer 26a. While the load can include other circuit elements, an effective capacitance of the load can be dominated by capacitance from the ESD protection circuit 24a and the buffer 26a in certain applications. The termination circuit 22a can provide termination for RF signals that result from crosstalk from an adjacent RF I/O line. For instance, crosstalk can result from coupling between the bond wire 16b and the bond wire 16a. More details regarding the termination circuit 22a and some sources of crosstalk will be provided with reference to FIGS. 2A, 2B, 2C and 3. Any of the termination circuits shown in FIG. 1 can implement any suitable combination of features of any of the termination circuits discussed herein, such as the termination circuits of FIG. 2A, 2B, 2C, or 3. The ESD protection circuit 24a can be any circuit that provides suitable ESD protection for a particular application. In some instances, the ESD protection circuit 24a can be rated to provide at least about 500 V of ESD protection, at least about 1 kV of ESD protection, or at least about 4 kV of ESD protection. The buffer 26a can buffer the digital signal carried by the digital I/O line 20a and provide the buffered digital signal to other circuit elements of the die 12. For instance, the buffered digital signal can be provided to digital circuits on the die 12 for further processing. The buffer 26a can be implemented by one or more inverters. The buffer 26a can be a non-inverting buffer. In some instances, the buffer 26a can be an inverting buffer that outputs a signal that is inverted relative to the digital signal received by the buffer 26a. Such an inverting buffer can be implemented by an odd number of inverters.

Other digital I/O lines and associated circuitry can implement any combination of features discussed with reference to the digital I/O line 20a and its associated circuitry. For instance, all of the digital I/O lines and associated circuits illustrated in FIG. 1 include instantiations of the same elements. As shown in FIG. 1, digital I/O lines that are not adjacent to an RF I/O can include a termination circuit. In some other implementations, digital I/O lines that are not adjacent to an RF I/O may omit a termination circuit.

Figure 2A:
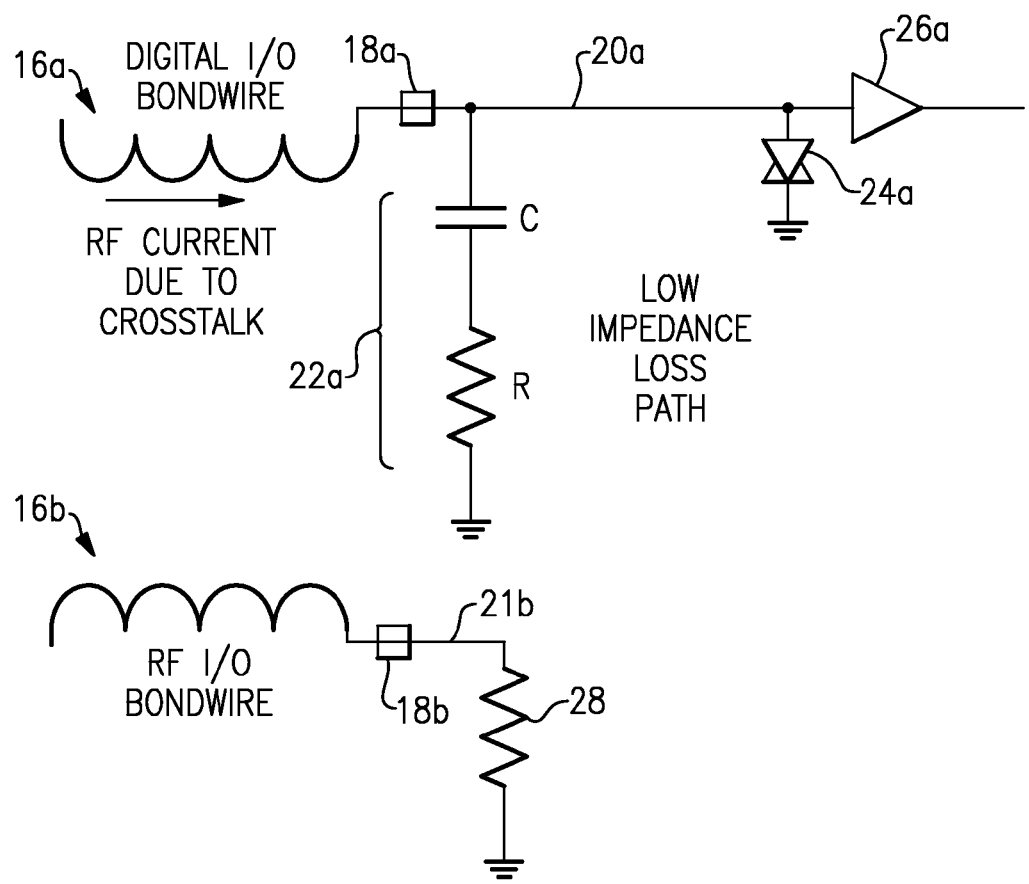
FIGS. 2A, 2B, and 2C are a schematic diagrams that each include an input/outline line that experiences radio frequency current due to crosstalk and a termination circuit electrically connected to the input/output line, according to certain embodiments.

Referring to FIG. 2A, a schematic diagram that includes an I/O that experiences radio frequency current due to crosstalk and a termination circuit electrically connected to the I/O will be described. FIG. 2A illustrates a portion of the electronic device 1 of FIG. 1. In FIG. 2A, a digital I/O path is physically close to an RF I/O path. For instance, the digital I/O path can include a bond wire that is routed adjacent to a bond wire of the RF I/O path. Bond pads associated with the digital I/O and the RF I/O, respectively, can be adjacent to each other on a die. While FIG. 2A shows a termination circuit electrically connected to a digital I/O line for illustrative purposes, the principles and advantages discussed with reference to any of the embodiments herein can be applied in connection with a termination circuit for preventing ripples on any suitable non-RF I/O path configured to carry a non-RF signal. Such a non-RF I/O path can be configured to carry a digital signal and/or an analog signal outside of the RF range.

A digital I/O on an integrated circuit die can be electrically connected to an ESD protection circuit 24a and an I/O buffer 26a as illustrated in FIG. 2A. A digital I/O path can carry a digital signal that is a non-RF signal. The ESD protection circuit 24a and the I/O buffer 26a can present an effective high Q capacitance to the digital I/O path. Without the termination circuit 22a, an RF current can undesirably be introduced on the digital I/O path due to crosstalk. Inductance from the coupling between the RF I/O bond wire 16b and the digital I/O bond wire 16a can resonate with the effective capacitance on the digital bond pad 18a of the die without a proper termination circuit on the digital I/O path. The coupling can be inductive coupling. The effective capacitance on the digital bond pad 18a of the die can be dominated by the ESD protection circuit 24a and the I/O buffer 26a.

In an illustrative example, a digital attenuator can be included in the die 12 to provide up to about 30 dB of attenuation for the RF I/O, and the digital attenuator can be controlled by one or more signals carried on the digital I/O. In this example, a resonance on the digital I/O path can create a relatively sharp loss of power over frequency for the RF I/O path and would be desirably avoided or dampened. Such resonance can create ripples in the attenuation frequency response. In general, resonance from the load on the digital I/O can create notches and/or overshoots in a frequency response of a circuit electrically connected to the digital I/O.

In FIG. 2A, the termination circuit 22a includes a low impedance loss path. The low impedance loss path is in parallel with the effective capacitance of the load on the digital I/O die pad 18a. As illustrated, the load includes the ESD protection circuit 24a and the I/O buffer 26a. The effective capacitance of the load can be modeled by a capacitor having a first end electrically connected to the digital I/O line 20a and a second end electrically connected to ground. The illustrated low impedance loss path is a series RC circuit that includes a capacitor C and a resistor R. The amounts of capacitance and resistance of the capacitor C and the resistor R can be selected such that the termination circuit terminates at a frequency of the RF signal carried by the RF bond wire 16b. The capacitance of the capacitor C can be selected such that it is greater than the effective capacitance of the ESD protection circuit 24a and the I/O buffer 26a. For instance, in certain implementations, the capacitance of the capacitor C can at least about 5 times the effective capacitance of the ESD protection circuit 24a and the I/O buffer 26a. As one example, the resistor R can have an impedance that is between the impedance of the capacitor C and the effective capacitance of the load at a frequency of an RF signal carried by the RF bond wire 16b.

As an example, if an effective capacitance of a digital load is about 200 fF, which can have an impedance of about $-j160$ Ohms at an operating frequency of 5 GHz, the capacitance of the capacitor C can be selected to be about 1 pF, which corresponds to an impedance of about $-j30$ ohms at 5 GHz, wherein j corresponds to the square root of negative 1. More generally, the capacitance of the capacitor C can be selected to be relatively large such that the termination impedance dominates an impedance of the digital load at a selected frequency and provides a "real" impedance or resistive load for dampening oscillations. For instance, the capacitance of the capacitor C can be selected such that the impedance at the RF frequency of the capacitor C is approximately five times lower than the impedance of the load at the selected frequency. The resistance of the resistor R can be selected such that the associated resonant circuit has a quality factor of less than 1. In the example above with the capacitor C having a capacitance of about 1 pF, the resistor R can have an impedance of about 50 Ohms. This can provide a Q of 0.6 at 5 GHz (j30/50=0.6). In this example, the magnitude of the impedance of the low impedance loss path should be less than magnitude of the digital load at the selected frequency (e.g., 5 GHz).

In FIG. 2A, a first end of the series RC circuit is electrically connected to the digital I/O die pad 18a and a second end of the series RC circuit is electrically connected to a ground potential. Accordingly, the series RC circuit is a series RC shunt circuit. The low impedance loss path can dampen the resonance of the load on the die that is connected to the digital I/O die pad 18a. At the same time, the low impedance loss path can prevent the crosstalk from the RF I/O bond wire 16b without significantly impacting the performance of the ESD protection circuit 24a. As such, the performance of the ESD protection circuit 24a can be maintained over a relatively wide bandwidth.

Figure 2B:
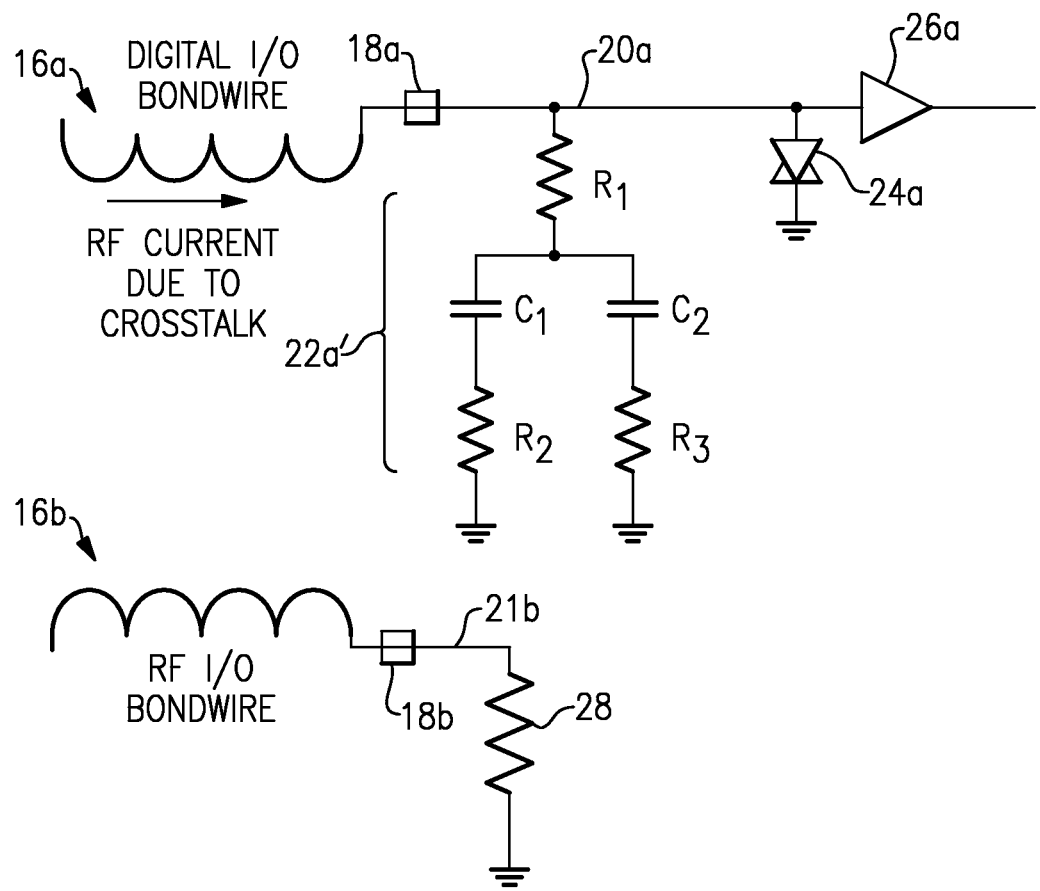
Figure 2C:
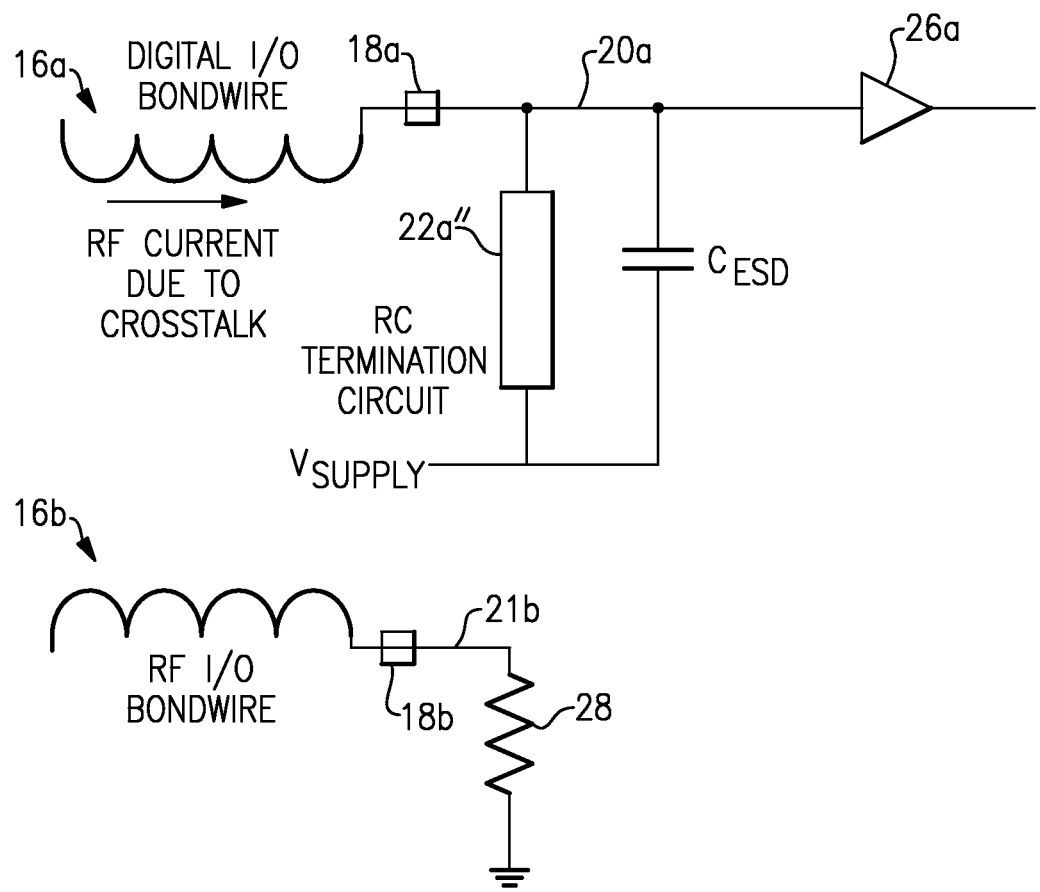

FIG. 2A illustrates an example termination circuit 22a. Other termination circuits can alternatively or additionally be implemented to prevent ripples on an I/O. FIGS. 2B and 2C provide two examples of such other termination circuits. Termination circuits configured to prevent ripples on I/Os can include, for example, an RC circuit, an RLC circuit, or multiple RC circuits and/or RLC circuits in parallel and/or in series. Such termination circuits can be electrically connected between an I/O path and ground or another reference voltage. Such termination circuits can be in parallel with an effective capacitance of an ESD protection circuit that is also electrically connected to the I/O line. Any of the termination circuits discussed herein can be electrically connected to any of the non-RF I/O paths discussed herein.

Referring to FIG. 2B, a schematic diagram that includes an I/O that experiences radio frequency current due to crosstalk and another embodiment of a termination circuit electrically connected to the I/O will be described. The circuits in FIG. 2B can be substantially the same as and/or functionally similar to the circuits of FIG. 2A, except that in FIG. 2B a termination circuit 22a' is implemented in place of the termination circuit 22a of FIG. 2A. In FIG. 2B, the termination circuit 22' includes parallel RC circuits. The termination circuit 22' also includes a first resistor R1 in series with the parallel RC circuits. The parallel RC circuits include a first RC circuit and a second RC circuit. The first RC circuit includes a first capacitor $C_1$ in series with a second resistor $R_2$. The second RC circuit includes a second capacitor $C_2$ in series with a third resistor $R_3$. As illustrated in FIG. 2B, the termination circuit 22' is electrically connected between the digital I/O path and ground. The termination circuit 22' is in parallel with an effective capacitance of an ESD protection circuit 24a. The resistances and capacitances of the elements of the termination circuit 22' can be selected to mitigate the effects of crosstalk with the RF I/O path shown in FIG. 2B.

Referring to FIG. 2C, a schematic diagram that includes an I/O that experiences radio frequency current due to crosstalk and another embodiment of a termination circuit electrically connected to the I/O will be described. The circuits in FIG. 2C can be substantially the same as and/or functionally similar to the circuits of FIGS. 2A and 2B, except that in FIG. 2C a termination circuit 22a" is implemented in place of the termination circuit 22a of FIG. 2A or the termination circuit 22' of FIG. 2B. In FIG. 2C, the termination circuit 22" includes an RC termination circuit that is electrically connected between the digital I/O path and a supply voltage $V_{SUPPLY}$. The termination circuit 22" is also electrically connected in parallel with an effective capacitance of an ESD protection circuit. In FIG. 2C, the effective capacitance of the ESD protection circuit is illustrated as a capacitor $C_{ESD}$. FIG. 2C illustrates that any of the termination circuits discussed herein can be electrically connected between a non-RF I/O path and a reference voltage. The reference voltage can be, for example, a supply voltage as illustrated in FIG. 2C. In some other embodiments, such as the embodiments of FIGS. 2A and 2B, the reference voltage can be ground. The reference voltage can also be a different voltage than ground or a supply voltage in certain implementations.

Figure 3:
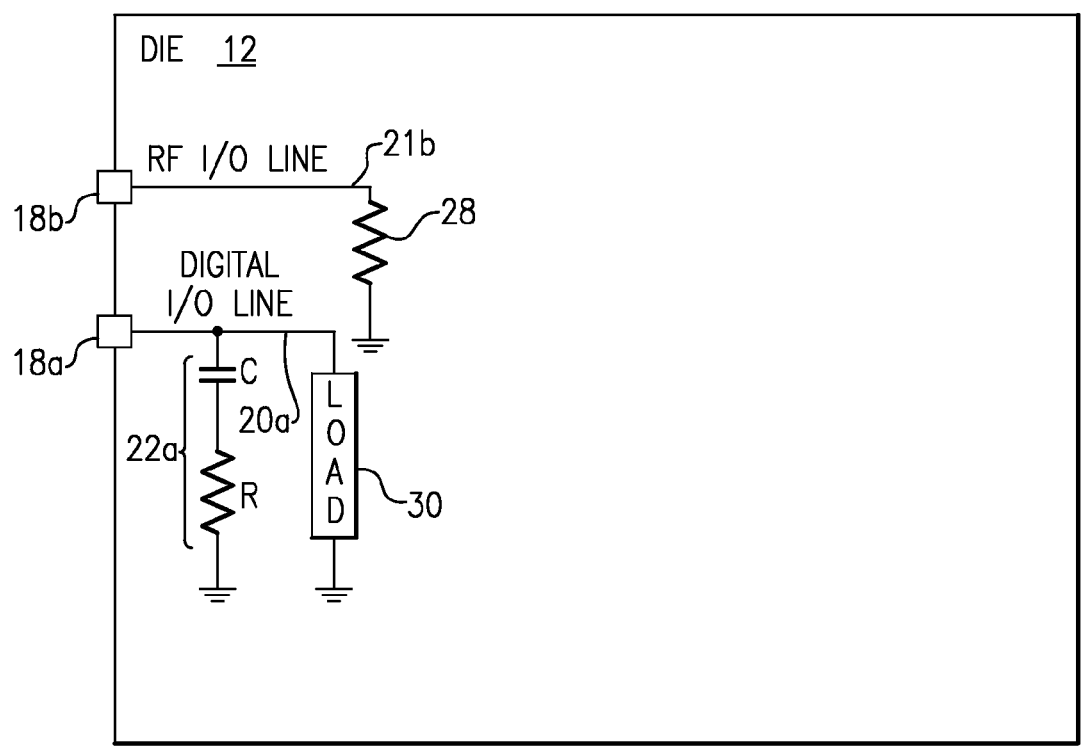
FIG. 3 is a schematic diagram of a die that includes a radio frequency input/output line and another input/output line that is electrically connected to a termination circuit, according to an embodiment.

Referring to FIG. 3, a schematic diagram of a die 12 that includes a radio frequency input/output line 21b and another input/output line that is electrically connected to a termination circuit 22a will be described. It will be understood that the die 12 can include more elements than illustrated and/or that some embodiments include a subset of the illustrated elements. The die 12 of FIG. 3 can include any combination of features of the die 12 discussed with reference to FIG. 1.

In FIG. 3, the die 12 includes a plurality of I/O contacts. The I/O contacts can include die pads 18a and 18b as illustrated. In other embodiments, the I/O contacts can be implemented by pins, solder bumps, beam leads, or the like. A first contact of the die 12, such as the first bond pad 18b, can receive an RF signal and provide the RF signal to an RF I/O line 21b that carries the RF signal to an RF load 28. The RF I/O line 21b is included in an RF I/O path that is configured to process RF signals. A second contact of the die 12, such as the second bond pad 18a, can receive a second signal and provide the second signal to a second I/O line. The second I/O line can be any suitable line electrically connected to a contact of the die 12 with a capacitive load coupled thereto. The second signal can be a non-RF signal. Accordingly, the second I/O line can provide the second signal to circuits that are configured to process signals at frequencies other than RF frequencies, such as at baseband or direct current (DC). As shown in FIG. 3, the second signal can be a digital signal provided to the digital I/O line 20a. The digital I/O line 20a can be included in a digital I/O path that is configured to process digital signals. The second signal can be provided to a load 30 on the die 12. The load 30 can include an ESD protection circuit and/or an I/O buffer, for example.

The termination circuit 22a is also included on the die 12 of FIG. 3. In some other embodiments, some or all of the termination circuit 22a can be implemented external to the die 12. Such an external termination circuit can include a resistor external to the die 12 and/or a surface mounted capacitor, for example. The termination circuit 22a can mitigate effects of crosstalk from the RF I/O line 21b on the second I/O line. For instance, the termination circuit 22a can prevent crosstalk from the RF I/O line 21b from creating a resonance on the second I/O line, such as a resonance due to the effective capacitance of the load 30 resonating. The termination circuit 22a can prevent crosstalk from the RF I/O from significantly impacting performance of an ESD protection circuit of the load 30 over frequency.

Various types of coupling can cause crosstalk between the RF I/O path and the second I/O path. For instance, as discussed above, such crosstalk can be due to coupling between adjacent bond wires. In other instances, crosstalk between the RF I/O path and the second I/O path can be due to coupling between conductive traces on a printed circuit board, due to on die coupling between these paths through a substrate, the like, or any combination thereof. The termination circuit 22a can mitigate the effects of crosstalk from any of these types of coupling.

The systems, apparatus, and methods related to ripple termination on I/Os are described above with reference to certain embodiments. A skilled artisan will, however, appreciate that the principles and advantages of the embodiments can be used for any other systems, apparatus, or methods with a need for a termination circuit on an I/O.

Such systems, apparatus, and/or methods can be implemented in various electronic devices. Examples of the electronic devices can include, but are not limited to, consumer electronic products, parts of the consumer electronic products, electronic test equipment, etc. Examples of the electronic devices can also include control chips, memory chips, memory modules, circuits of optical networks or other communication networks, and disk driver circuits. Some example control chips include a digital attenuator, a voltage variable attenuator, a switch component including a multi-throw switch, and a phase shifter. The consumer electronic products can include, but are not limited to, precision instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments have been described, these embodiments have been presented by way of example only, and are not intended to limit the scope of the disclosure. Indeed, the novel apparatus, systems, and methods described herein may be embodied in a variety of other forms. For instance, it will be understood that the principles and advantages discussed herein can be used in any suitable integrated circuit with a need for a termination circuit on an I/O. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. An electronic device comprising:
a die comprising a radio frequency (RF) input/output path electrically connected to a first bond pad of the die and a second input/output path electrically connected to a second bond pad of the die, the RF input/output path configured to process an RF signal, and the second I/O path configured to process a second signal, the second signal being a non-RF signal;
a first bond wire electrically connected to the first bond pad of the die; and
a second bond wire electrically connected to the second bond pad of the die; and
a termination circuit electrically connected to the second bond pad of the die, the termination circuit configured to mitigate against effects of crosstalk due to coupling between the first bond wire and the second bond wire by providing a load for the second I/O path such that the second I/O path is dampened.

2. The electronic device of claim 1, wherein the die comprises an electrostatic device protection circuit in parallel with the termination circuit.

3. The electronic device of claim 1, wherein the termination circuit is embodied in the die.

4. The electronic device of claim 1, wherein the termination circuit comprises a series RC circuit.

5. The electronic device of claim 1, wherein the second input/output path is a digital input/output path and the second signal is a digital signal.

6. The electronic device of claim 1, wherein the termination circuit is configured to prevent a load on the die that is electrically connected to the second bond pad from resonating due to the crosstalk.

7. The electronic device of claim 1, further comprising a package encapsulating the die, the first bond wire, and the second bond wire, wherein the package comprises a first pin and the first bond wire is electrically connected to the first pin.

8. The electronic device of claim 1, wherein the die comprises at least one of an attenuator, a switch, or a phase shifter.

9. An apparatus comprising:
a first input/output path electrically connected to a first contact of a die, the first input/output path configured to carry a radio frequency signal;
a second input/output path electrically connected to a second contact of the die, the second input/output path configured to carry a second signal, wherein the second signal is a non-RF signal, and wherein there is crosstalk between the first input/output path and the second input/output path; and
an RC circuit electrically connected between the second contact of the die and a reference potential.

10. The apparatus of claim 9, further comprising an electrostatic discharge protection circuit on the die, wherein the RC circuit is in parallel with the electrostatic discharge protection circuit.

11. The apparatus of claim 9, wherein the second signal is a digital signal.

12. The apparatus of claim 9, further comprising a first bond wire electrically connected to the first contact of the die and a second bond wire electrically connected to the second contact of the die, wherein the first input/output path is configured to couple with the second input/output path by way of coupling between the first bond wire and the second bond wire.

13. The apparatus of claim 9, wherein the RC circuit is a series RC circuit.

14. The apparatus of claim 9, wherein the RC circuit is configured to prevent an effective capacitance of a load of the die electrically connected to the second input/output path from resonating due to crosstalk between the first input/output path and the second input/output path.

15. The apparatus of claim 14, wherein the load comprises an electrostatic discharge protection circuit and an input/output buffer.

16. The apparatus of claim 14, wherein the crosstalk is due to coupling external to the die.

17. The apparatus of claim 9, wherein the reference potential is ground.

18. A die comprising:
a first input/output path configured to carry a radio frequency signal;
a second input/output path configured to carry a non-RF signal;
an electrostatic discharge protection circuit configured to provide electrostatic discharge protection on the second input/output path; and
a low impedance loss path configured to present an impedance at a frequency of the radio frequency signal to prevent a resonance on the second input/output path due to crosstalk between the first input/output line and the second input/output line.

19. The die of claim 18, wherein the crosstalk is due to coupling on the die.

20. The die of claim 18, wherein the low impedance loss path comprises a series RC circuit.

* * * * *